United States Patent [19]

Fox et al.

[11] Patent Number: 5,479,340

[45] Date of Patent: Dec. 26, 1995

[54] REAL TIME CONTROL OF PLASMA ETCH UTILIZING MULTIVARIATE STATISTICAL ANALYSIS

[75] Inventors: Edward P. Fox; Chandru Kappuswamy, both of Austin, Tex.

[73] Assignees: Sematech, Inc., Austin, Tex.; Intel Corporation, Santa Clara, Calif.

[21] Appl. No.: 124,146

[22] Filed: Sep. 20, 1993

[51] Int. Cl.⁶ .................................................... G06F 15/46
[52] U.S. Cl. .......................... 364/153; 364/148; 364/552; 364/164; 364/468; 437/7; 437/939
[58] Field of Search .................................... 364/152, 153, 364/148, 130, 164, 165, 468, 477, 554, 552, 550; 437/7, 8, 225, 228, 939

[56] References Cited

U.S. PATENT DOCUMENTS

| | | | |
|---|---|---|---|
| 4,809,196 | 2/1989 | Miller | 364/550.01 |
| 5,150,289 | 9/1992 | Badavas | 364/154 |
| 5,325,019 | 6/1994 | Miller et al. | 315/111.21 |
| 5,392,226 | 2/1995 | Hamilton | 364/551.01 |

OTHER PUBLICATIONS

1982–ASQC Quality Congress Transactions—Detroit, Multivariate Quality Control: State of the Art, Frank B. Alt, May 1982, pp. 886–893.
Technometrics, Quality Control Methods for Several Related Variables, J. Edward Jackson, vol. 1, No. 4, Nov. 1959, 359–377.
Encyclopedia of Statistical Sciences, vol. 6, Multivariate Analysis to Plackett and Burman Designs, Multivariate Quality Control, John Wiley & Sons, 1985, pp. 110–122.
Statistical Methods for Quality Improvement, Thomas P. Ryan, Chapter 9, Multivariate Control Charts for Measurement Data, John Wiley & Sons, Inc. 1989, pp. 215–229.

Primary Examiner—Emanuel T. Voeltz
Assistant Examiner—Craig Steven Miller
Attorney, Agent, or Firm—William W. Kidd

[57] ABSTRACT

Hotelling's $T^2$ statistical analysis and control is used to provide multivariate analysis of components of an RF spectra for real time, in-situ control of an ongoing semiconductor process. An algorithm calculates the $T^2$ value which is then used to generate a feedback signal, if the $T^2$ value is out of range, to indicate an out-of-tolerance condition.

10 Claims, 2 Drawing Sheets

REAL TIME CONTROL OF PLASMA ETCH UTILIZING MULTIVARIATE STATISTICAL ANALYSIS

BACKGROUND OF THE INVENTION

1. Field of the Invention

The present invention relates to the field of semiconductor processing equipment and, more particularly, to a technique of utilizing multivariate analysis for monitoring and controlling a plasma process.

2. Prior Art

In the fabrication and processing of semiconductor wafers, such as silicon wafers, a variety of different semiconductor equipment and/or tools are utilized. These processing tools are well known in the prior art and include photolithographic machines, etchers, deposition equipment, furnaces, as well as a variety of sensors and control equipment. Although the capabilities of these types of semiconductor processing equipment have improved over the years, the technique of monitoring the ongoing process has not necessarily kept pace with the improvements. In the field of monitoring the ongoing semiconductor process, current practices generally utilize ex-situ process monitoring. A problem with ex-situ monitoring is that the results are not available until the end of the process or if intermediate readings are required, the ongoing process must necessarily be interrupted in order to obtain the required reading.

Furthermore, where a number of parameters are monitored for a given process, it is difficult to determine the dependency of one parameter to the others. Such processing parameter correlations are difficult to obtain, but are made so much more difficult when measurements are being taken for the purpose of providing in-situ control of the ongoing process.

The present invention provides for a technique to obtain real-time, in-situ control of a plasma process and, more specifically, in the processing of semiconductor wafers.

SUMMARY OF THE INVENTION

A technique of utilizing multivariate statistical analysis for monitoring and controlling an ongoing semiconductor process is described. A Hotelling's $T^2$ analysis is utilized to provide real time, in-situ control of a plasma process. Eleven components of the RF spectra are measured and converted as input variables to the $T^2$ calculation. A software routine provides the necessary calculations to solve for Hotelling's $T^2$ value.

The $T^2$ output is then used to determine if the plasma process is within an acceptable tolerance. If not, a feedback control signal is generated to notify the error condition. The control signal can also be used to stop or correct the ongoing process.

In order to establish the necessary mean vector and the inverse variance/covariance matrix to perform the calculations, a number of samples are run beforehand to establish a statistically known baseline.

Thus, it is an object of the present invention to provide for a multivariate analysis of a number of interrelated parameters pertaining to processing a semiconductor wafer.

Another object of the present invention is to use Hotelling's $T^2$ analysis on components of the RF spectra of a plasma process.

Another object of the present invention is to provide for real time, in-situ control of a semiconductor process.

Economic Advantage

By the practice of the present invention undesirable processing of a wafer can be interrupted or controlled, thereby resulting in less waste and potentially obtaining a higher production yield.

DETAILED DESCRIPTION OF THE PREFERRED EMBODIMENTS

A technique for providing real-time, in-situ control of a plasma process which is utilized in the fabrication of integrated circuits on a semiconductor wafer is described. In the following description, numerous specific details are set forth, such as specific parameters, measuring techniques, algorithms, etc., in order to provide a thorough understanding of the present invention. However, it will be obvious to one skilled in the art that the present invention may be practiced without these specific details. In other instances, well-known processes and devices have not been described in detail in order not to unnecessarily obscure the present invention.

Figure 1:
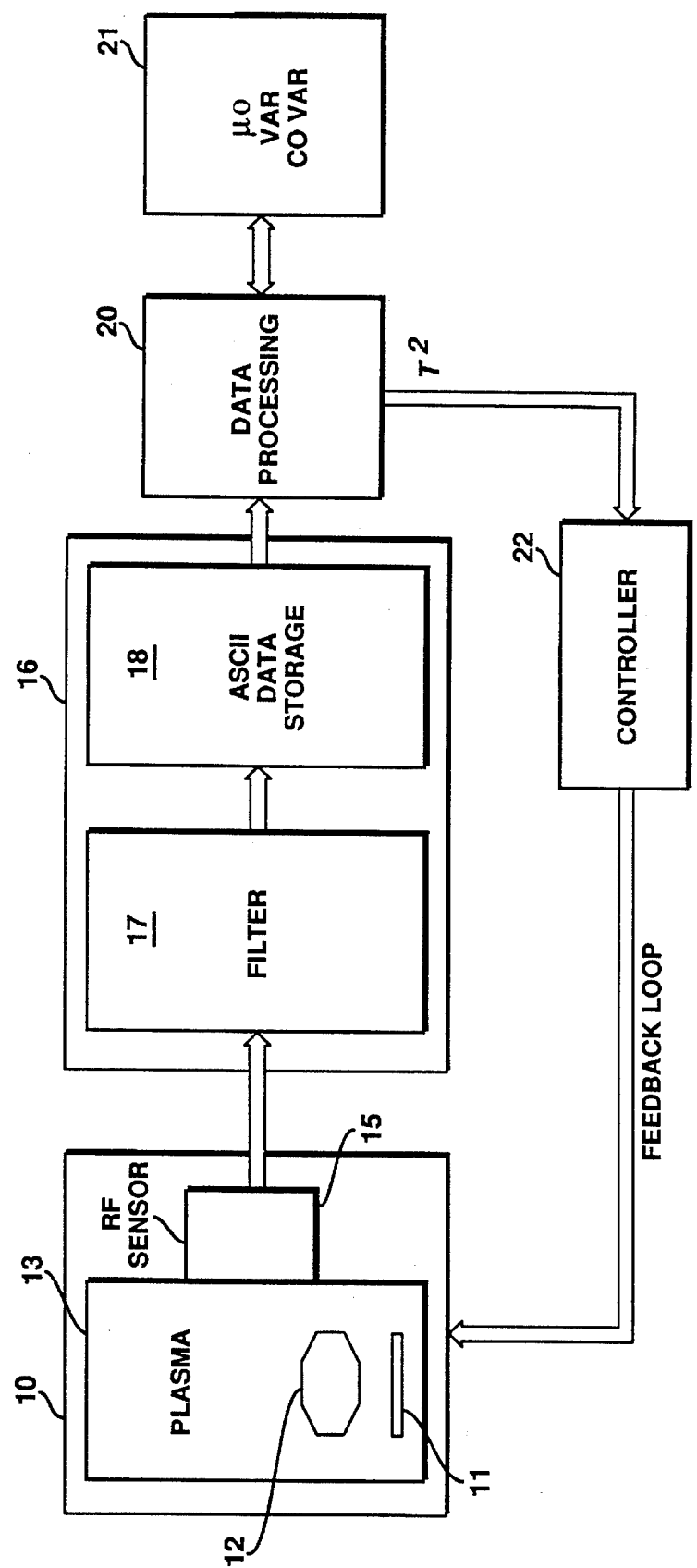
FIG. 1 is a block diagram illustrating an equipment of the preferred embodiment and utilization of information by the equipment to provide a multivariate analysis based on Hotelling's $T^2$ analysis to control a plasma process.

Referring to FIG. 1, a plasma processing equipment (also referred to as a tool) 10 is shown in which a wafer 11 to be processed is contained in a reactor chamber 13 of tool 10. A plasma 12 is formed within the chamber 13 for processing the wafer 11. In the preferred embodiment, the processing tool 10 is a plasma etcher in which the plasma 12 in chamber 13 is utilized to etch one or more layers of wafer 11. The use of such plasma tools to process semiconductor wafers, especially silicon wafers, is well-known in the art. Furthermore, although a specific tool 10 is described, a variety of processing equipment can be readily adapted for use with the practice of the present invention.

A sensor 15 is coupled to processing tool 10 in order to monitor a particular property resident within chamber 13. In the particular example described in reference to the preferred embodiment, a radio frequency (RF) sensor is utilized for sensor 15 in order to measure RF properties within chamber 13. The use of a RF signal to generate plasma in a reactor chamber is well known in the art. A variety of prior art RF sensors can be readily adapted as sensor 15 to measure RF parameters resident within chamber 13. The preferred embodiment uses a RF Metrology System (RFMS) Model 13.56, which is manufactured by Fourth State Technology of Austin, Tex.

Furthermore, it is to be appreciated that other properties within the chamber 13 can be readily monitored depending on the particular application and the sensor used. The present invention utilizes an RF sensor since RF component parameters (RF spectra) of the plasma 12 are the parameters of interest for monitoring the etching process within chamber 13. The RF signal from RF sensor 15 is coupled to a filter 17, which is part of the data collection system 16 of the present invention. The raw data from the RF sensor 15 is separated into eleven components of RF by filter 17. A variety of prior art filter units can be utilized for filter 17, in order to separate the RF spectra into eleven components as follows:

V0—Peak Fundamental Voltage
V1—Peak First Harmonic Voltage
V2—Peak Second Harmonic Voltage
V3—Peak Third Harmonic Voltage
V4—Peak Fourth Harmonic Voltage
I0—Peak Fundamental Current
I1—Peak First Harmonic Current
I2—Peak Second Harmonic Current
I3—Peak Third Harmonic Current
I4—Peak Fourth Harmonic Current
$\phi$—Phase Angle Between the Fundamental V & I Actually in practice, the RF sensor 15 measures the RF voltage and RF current signals from the reactor chamber 13 and couples the two signals to filter 17 for filtering. The filter 17 is actually comprised of separate filters. The voltage signal is filtered to derive the fundamental and the harmonic components of voltage. The current signal is likewise filtered to obtain the fundamental and harmonic components of current. The phase relationship is determined by measuring the phase angle between the fundamental voltage and the fundamental current.

The fundamental frequency of the tool 10 of the preferred embodiment was established at 13.56 MHz. Each of the eleven component values are then stored as digital data in data storage memory 18. In the preferred embodiment, this data is stored as ASCII data files in memory 18. Memory 18 can be of a variety of memory storage devices and in the preferred embodiment, memory 18 is a part of a hard disk in a personal computer (PC).

The eleven components of the RF were chosen since the operating characteristic of the plasma 12 in chamber 13 can be readily determined by looking at the voltage and current (V-I) characteristic of the fundamental and harmonic frequencies of the RF. The use of the V-I characteristics of fundamental and harmonic frequencies to determine plasma properties is described by Miller et al. in U.S. Patent application entitled, "Independent Control of Voltage and Current in High Frequency Electrical Discharges", Ser. No. 07/934,091, filing date Aug. 21, 1992 (now U.S. Pat. No. 5,325,019 with a new title of "Control Of Plasma Process By Use Of Harmonic Frequency Components Of Voltage And Current"). It is to be appreciated, that once the RF component values are stored within memory 18, each of the component data can be analyzed independently in order to analyze the ongoing process within chamber 13.

However, the problem encountered in analyzing all of the eleven component values independently is that these values are not truly independent in their relationship to each other. That is, these eleven components of the RF spectra are related to each other since they are components of the same RF signal. Thus, adjusting one of the components will more than likely cause one or more of the other components to vary as well. Although it would be ideal to have a signature of each of the components for a given process and for that signature to be obtained by tuning each of the components of the RF signal, in reality, the interrelationship of the RF components prohibit such complicated tuning procedures for real time, in-situ control of the ongoing semiconductor process.

Accordingly, the present invention relies on a statistical algorithm to determine the interrelationship of the eleven RF components to arrive at a range of values which is identified with the proper operation of the ongoing plasma process in reactor chamber 13.

In order to achieve real time, in-situ control of the plasma process by monitoring the eleven components of the RF signal, the preferred embodiment utilizes a statistical algorithm to generate a feedback control signal. The preferred embodiment utilizes Hotelling's $T^2$ multivariate technique for providing a quality control signal which is dependent on the measured input data. The use of the Hotelling's $T^2$ multivariate analysis is a statistical method well known in the prior art. Due to the correlation of the various components of the RF spectra to each other, multivariate statistical analysis provides for a more reasonable approach in analyzing the multiple measurements as compared to the univariate technique for single measurement control. The techniques for utilizing multivariate analysis and, specifically utilizing Hotelling's $T_2$ calculations for control methods are described in:

1) Thomas P. Ryan, "Multivariate Control Charts for Measurement Data," STATISTICAL METHODS FOR QUALITY IMPROVEMENT, Chapter 9, 1989, John Wiley & Sons, Inc., pp. 215–229.

2) J. Edward Jackson, "Quality Control Methods for Several Related Variables," TECHNOMETRICS, Vol. 1, No. 4, November 1959, pp. 359–377.

Furthermore, an advantage for utilizing Hotelling's $T^2$ technique over an univariate approach is described in the above-noted Ryan reference. Where upper control limit (UCL) and lower control limit (LCL) are utilized as a range of acceptable values around the mean, Ryan shows that there are instances where all of the component values are within range but the process itself is out of acceptable range. Conversely, Ryan also shows that where one or more components may be out of range, the whole process itself is within the acceptable limits. Thus, it is evident that a multivariate approach to analyzing the eleven components of the RF spectra is superior in determining the acceptable limits of the plasma process than looking at any one component of the RF spectra or alternatively, all eleven components independently of one another.

The use of control limits for establishing a control chart for a mean is also described in:

3) Alt, Frank B., "Multivariate Quality Control: State of the Art," 1982 -36TH ANNUAL QUALITY CONGRESS TRANSACTIONS-DETROIT, May 1982, pp. 886–893.

4) "Multivariate Quality Control," Encyclopedia of Statistical Sciences, Volume 6, "John Wiley & Sons, 1985, pp. 110–122.

In order to take advantage of the multivariate analysis of Hotelling's $T^2$ technique, the present invention generates a control signal based on the multivariate analysis of the eleven components of the RF spectra. In the preferred embodiment, this is achieved in software by generating an algorithm for calculating Hotelling's $T^2$ multivariate control equations.

The mathematical algorithm for calculating Hotelling's $T^2$ is:

$$T^2 = n(x' - \mu_o) S^{-1} (x' - \mu_o) \quad \text{(Equation 1)}$$

where $S^{-1}$ is the inverse of the sample variance-covariance matrix S and n is the sample size upon which each x' (input) value is based. The x' and $\mu_o$ are vectors while the $S^{-1}$ is a matrix. The matrix algebra to calculate the $T^2$ value using Equation 1 is well-known in the art and, further, described in the references 1–4 cited above.

In the preferred embodiment the application of the algorithm is applied to the eleven RF spectra components which become the eleven input variables ($x_1$–$x_{11}$) to the $T^2$ algorithm. The $\mu_o$ values ($\mu_{o(1)}$–$\mu_{o(11)}$), as well as the inverse variance-covariance ($S^{-1}$) table are calculated beforehand, as will be explained later in the description. Since single set of readings are taken during processing, the value of n is one. Thus, the preferred embodiment relies on the following equation for the calculation of the $T^2$ value for each RF signal reading obtained.

$$T^2 = (x' - \mu_o) S^{-1} (x' - \mu_o) \qquad \text{(Equation 2)}$$

In the particular application of the preferred embodiment, $$T^2 = (\text{Input}_{[i]} - \text{Mean}_{[i]}) * \qquad \text{(Equation 3)}$$
$$(\text{VAR/COVAR})^{-1} * (\text{Input}_{[i]} - \text{Mean}_{[i]})$$

in which $i$=1 through 11, and
where Input $_{[1]}$ through Input$_{11}$ correspond to V0, V1, V2, V3, V4, I0, I1, I2, I3, I4 and $\phi$.

Accordingly Matrix 1 is determined as:

$$\begin{array}{l}[\text{Input } V0 - \text{Mean } V0] \\ [\text{Input } V1 - \text{Mean } V1] \\ [\text{Input } V2 - \text{Mean } V2] \\ \vdots \\ [\text{Input } \phi - \text{Mean } \phi] \end{array} \qquad \text{(Equation 4)}$$

Matrix 2 is determined from the variances and covariances of all the input variables:

$$[\text{VARIANCES and COVARIANCES}]^{-1} = \qquad \text{(Equation 5)}$$
$$[\sigma^2 \text{ and } \sigma - 1]^{-1}$$

Matrix 3 is then determined as:

$$\text{MATRIX } \mathbf{3} = \text{MATRIX } \mathbf{1} * \text{MATRIX } \mathbf{2} \qquad \text{(Equation 6)}$$

Finally:

$$T^2 = \text{MATRIX } \mathbf{3} * \text{MATRIX } \mathbf{1} \qquad \text{(Equation 7)}$$

As noted previously, the mean V0 ... mean $\phi$ values, as well as the $S^{-1}$ table, are calculated and stored beforehand in order to perform Equations 4–7.

Although a variety of computer systems and languages can be used to perform Hotelling's $T^2$ calculations, the preferred embodiment implements the particular algorithm in RPL language and the RPL instructions for achieving this is shown in Table I. The computer system for processing the algorithm is a PC.

In reference to FIG. 1, the algorithm for calculating the $T^2$ is retained as a software program in block 20. The input values from storage unit 18 are accessed by the algorithm to calculate the $T^2$ value for the respective set of inputs. Also stored in a memory 21 are the mean, variance and covariance values which are needed for the $T^2$ calculation. The output of block 20 is the $T^2$ value determined by Hotelling's $T^2$ control algorithm. This $T^2$ value is then used as an input to the controller block 22. The algorithm storage of block 20 and memory 21 are actually also parts of the hard disk on the PC.

Block 22, in essence, determines the value of the $T^2$ which is acceptable for a given process being run in tool 10. For each given process, there is an acceptable range of $T^2$ values for validating that process. For example, a mean $T^2$ value is bounded by an acceptable range of values determined as the upper control limit (UCL) and the lower control limit (LCL), as similarly described in the earlier cited references. A variety of techniques can be utilized to determine the UCL and LCL of the $T^2$ values coupled to the controller block 22. One statistical approach which is commonly used is the Chisquare ($\chi^2$) distribution approach to determine the acceptable limits of the $T^2$ value. Although this $\chi^2$ distribution analysis is acceptable, the preferred embodiment has selected a range which is commensurate with each of the processes being run in tool 10. The ideal Hotelling's $T^2$ values for a process are determined by running a number of samples and developing a baseline for that particular process.

In order to obtain a "bench mark" of the baseline numbers, a statistically acceptable number of wafers are processed in order to collect the mean, variance and covariance values for the eleven RF components. For example, in a plasma etch process, it is recommended that at least a minimum of twenty-five wafers be run and twenty-five separate sets of component data collected. That is, for a given etch step, 25 test wafers are processed (n=25) in which the 11 RF component values are recorded at periodic time intervals during the etch process. Then, after all test wafers are run and component values recorded, the n sets of values are used to calculate $\mu_o$ for each component. The values are then stored in memory 21 as a vector for calculating Matrix 1 values. Similarly the n sets are used to develop the inverse variance-covariance Matrix 2, which is also stored in memory 21. This is done for each time period, such that a set of baseline $\mu_o$ and $S^{-1}$ values are obtained for each time period.

The parameter(s) which are used to measure the test wafers to develop the $T^2$ values is a design choice. For example, in a 30 second etch processing step, the parameter to control can be the film thickness of the semiconductor layer being etched. By obtaining a measurement reading every 1 second, 30 discrete steps are available to control the etch cycle. During the interval when RF readings are to be taken, the processor responsible for running the algorithm will calculate the $T^2$ values, thus providing real-time and in-situ operation. The type of parameters to be measured, as well as the time interval to obtain the measurements is strictly a design choice.

Furthermore, it may be that a given 30 second process warrants a calculation every 3 seconds. In that event, only the stored values from every third reading need be processed by the algorithm. It is to be appreciated that the above examples are provided for exemplary purpose only and that a variety of scenarios can be readily developed depending on the process being run.

In the practice of the preferred embodiment, a more accurate result can be obtained by having n equal to a higher number. The sample size n for determining the baseline calculations will depend on what statistically significant values are desired for $\mu_o$, $\sigma^2$ and $\sigma$–1 values. It is to be appreciated that in order to collect this data other approaches can be taken. For example, in another approach, test wafers with no geometries can be processed and the readings can be taken from the RF sensor and compared to the results. In still another approach, actual wafers can be processed, the values collected and then the geometries of the processed wafer can be measured at the conclusion of the process step to determine the extent of the measurements. Other techniques can be readily adapted as well.

Once the established baseline number of wafers are run, a baseline will exist in which the $T^2$ value can be calculated for each periodic time interval. Then, a mean can be calculated for the $T^2$ values at each of these time intervals. Subsequently, the UCL and the LCL limits can be established for each time period. Again the $\chi^2$ distribution can be applied to develop the UCL an LCL boundaries. Alternatively, some other criteria can be utilized as well. For example, in the preferred embodiment, an etching step was given arbitrarily acceptable boundaries. The UCL boundary was established as 150% of the mean $T^2$ value, while the LCL boundary was set at 50% of the $T^2$ value.

Once the baseline numbers have been stored in memory 18, the system is set up to control the ongoing process of a production wafer. Once the process commences on the wafer, the RF information is obtained and separated into the RF spectra component values. The 11 component values are stored in the data collection memory 18. Then, prior to the next time interval, the information is then processed by Hotelling $T^2$ algorithm in block 20 by using the baseline values stored in memory 21. A $T^2$ value is derived by using the aforementioned matrix algebra. If the $T^2$ value is within the acceptable UCL/LCL range for the given ongoing process, the controller 22 allows the process to continue. If the $T^2$ value is not within the acceptable UCL/LCL tolerance, an out of tolerance signal is generated.

Figure 2:
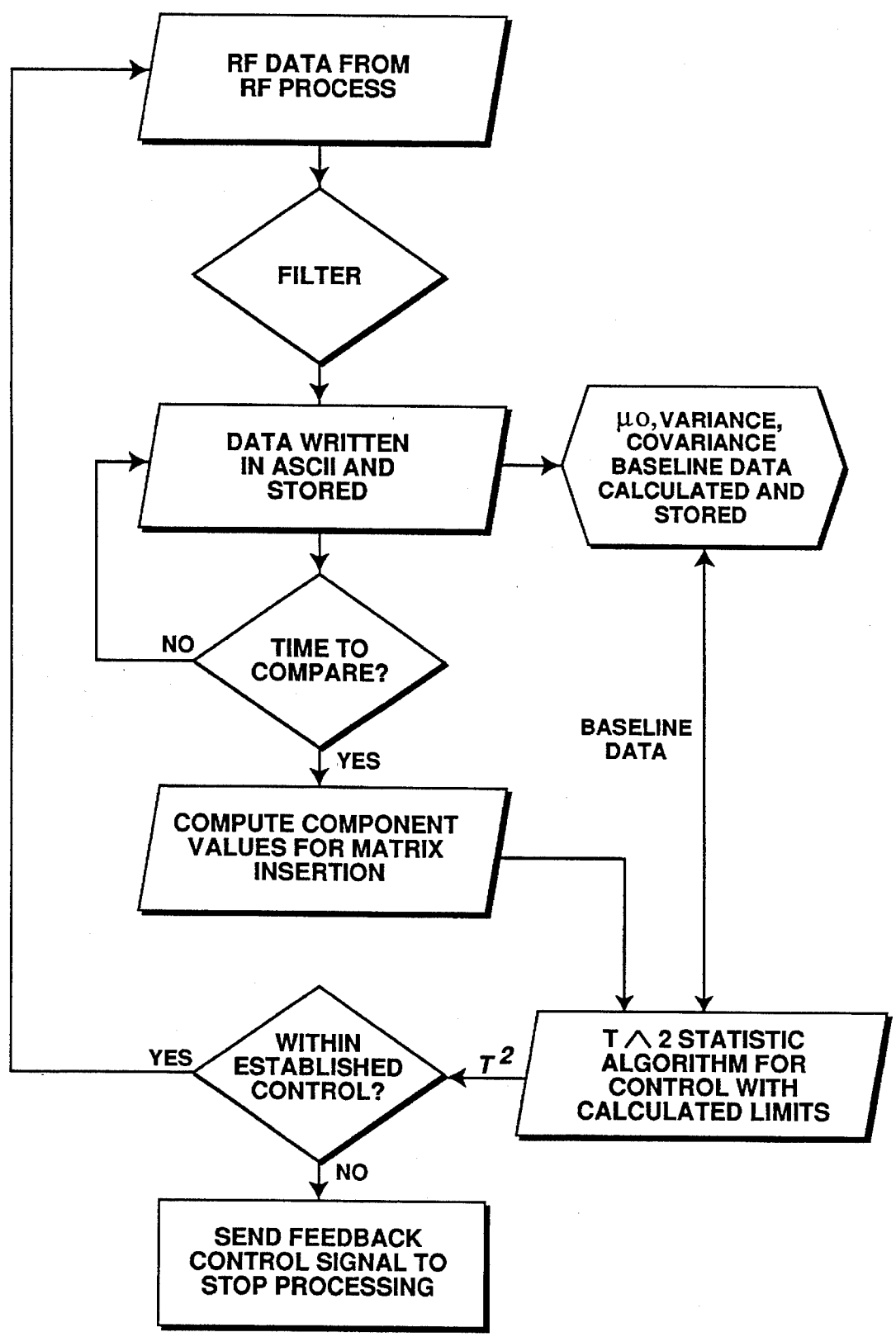
FIG. 2 is a flow diagram illustrating an operation of a software routine used to practice the present invention.

This out-of-tolerance control signal can be utilized in a number of ways. The simplest approach is to signal the operator or the control equipment that the wafer undergoing the process will more than likely have an undesirable result. Preferably, the control signal can be used to terminate the ongoing process within equipment 10. Another approach is to utilize the control signal to inform the data collection system to identify the component or components which may be causing the out-of-tolerance condition. If the tool is capable of compensating or adjusting to RF component variations, it could readily adjust for the out-of-tolerance parameter. A flow diagram exemplifying the operation of the software routine to perform the above analysis is illustrated in FIG. 2.

Therefore, by utilizing Hotelling's $T^2$ algorithm to provide for a multivariate control of process parameters, real time, in-situ control can be obtained to control a semiconductor process. However, it should be noted that algorithms based on other statistical controls (other than Hotelling's $T^2$) can be readily adapted for providing such in-situ control of an ongoing process without departing from the spirit and scope of the present invention.

Furthermore, it should be emphasized that although the preferred embodiment uses a PC to store and process information (that is, memories 18 and 21, as well as the storage of the algorithm program are all accomplished on a hard-disk of a PC and the processing and control of data transfer are performed by the processor in a PC), such processor/memory set-up is a design choice. In some instances, it could actually be made a part of tool 10. Thus, a real time feedback is provided for in-situ control of a semiconductor wafer process using a multivariate analysis technique.

TABLE I

```
/*PROCEDURE PT07_A TO COMPUTE T**2 STATISTIC FOR PET07
RUNS*/
PROCEDURE(PT07_A);
    T1 = GETTABLE("ENTER TABLE CONTAINING RAW DATA:"); /*11
input variables*/
    T2 = ("P07P_MEANS");/*Table of means of 11 variables from
prior runs*/
    T3 = ("INV07P_FT2);/*Table containing inverse var/covar
variables*/
    M3 = MAT$T2M("INV07P_FT2");/*Create matrix from table
above*/
    M1 = MAT$ALLOC(1,11);/*Allocate space for first step in
algorithm*/
    MSINV = MAT$ALLOC(1,11);/*allocate space for second step in
algorithm*/
        ALLOCATE TABLE ("TSQA07_A_FULLT") 200 ROWS BY 200
COLS;/*allocate space for results of overall algorithm*/
    DO i = 1 TO LASTROW (TI);
        MSINV = MAT$CONSTANT(1,11,0);/*Set matrices/vectors to
empty*/
        TSQAV = VEC$CONSTANT(1,0);
        M1 = MAT$CONSTANT(1,11,0);
            DO k = 1 TO 11;
            M1[1,k] = (T1[i,k] - T2 [1,k]);/*step 1 in T    2
algorithm, i = row #, k = col #, (data variable-same matrix
location means value)*/
                IF k <> 11 THEN DONEXT;/*column counter*/
                MSINV = MAT$MXM(M1,M3);/*means*inverse var-
covar matrics*/
                VSINV = MV$M2V(MSINV,FALSE);/*change matrix
to vector for next step in algorithm*/
                TSQAV = MV$MXV(M1,VSINV);/*Step 1 matrix *
step 3 vector for determination of T    2 for each row of
data*/
                "TSQA07_A_FULLT"[i, 2] = VEC$V2TEXT(TSQAV);
    /*change vector of T    2 to text Table for display*/
            END;
        END;
            DIS TABLE "TSQA07_A_FULLT";
END;
```

We claim:

1. A method for providing real time control of a semiconductor manufacturing process within a reactor by utilizing a multivariate statistical analysis to provide process control, comprising the steps of:
   a) determining reactor operating parameters which are associated with characterizing an on-going performance of said semiconductor manufacturing process, said parameters having correlated characteristics such that a change in one of said parameters causes a change in at least another one of said parameters, wherein said performance of said semiconductor manufacturing process is also changed;
   b) measuring said parameters by utilizing a monitoring device coupled to said reactor when said reactor is in operation to perform said semiconductor manufacturing process;
   c) providing measured reactor operating parameters as input variables to be operated on by performing said multivariate statistical analysis;
   d) performing said multivariate statistical analysis by use of a processor while said reactor is performing said semiconductor manufacturing process to obtain a probability value which corresponds to said performance of said semiconductor manufacturing process, wherein if said probability value is at a predesignated mean value, it corresponds to a desired performance of said semiconductor manufacturing process, but a variance from said mean value corresponds to a variation from said desired performance of said semiconductor manufacturing process, said multivariate statistical analysis evaluating overall performance of said semiconductor manufacturing process based on all of said parameters and not basing performance separately on each individual parameter;
   e) determining if said probability value resides within a predesignated acceptable range from said mean value for said semiconductor manufacturing process, wherein said probability value beyond said acceptable variation range indicates an unacceptable operating condition for said semiconductor manufacturing process;
   f) utilizing said probability value to monitor operation of said reactor while said semiconductor manufacturing process is on-going in said reactor;
   g) performing steps b) through f) until said semiconductor manufacturing process is completed or until said unacceptable operating condition is detected;
   h) correcting said unacceptable operating condition once detected by adjusting said reactor parameters until said probability value is back within said acceptable variation range;
   wherein real time in-situ control of said semiconductor manufacturing process is achieved by utilizing said multivariate statistical analysis.

2. The method of claim 1 wherein said multivariate statistical analysis is determined by utilizing Hotelling's $T^2$ distribution to calculate said probability value.

3. The method of claim 2 wherein said semiconductor manufacturing process is terminated in step h) when said unacceptable operating condition is noted in step g).

4. The method of claim 1 wherein said semiconductor manufacturing process is terminated in step h) when said unacceptable operating condition is noted in step g).

5. A method for providing real time control of a plasma etch process within a plasma reactor by utilizing a multivariate statistical analysis to provide process control, comprising the steps of:
   a) determining components of a radio frequency (RF) spectra which are associated with characterizing an on-going performance of said plasma etch process, said RF components having correlated characteristics such that a change in one of said RF components causes a change in at least another one of said RF components, wherein said performance of said plasma etch process is also changed;
   b) measuring said RF components by utilizing a monitoring device coupled to said reactor when said reactor is in operation to perform said plasma etch process;
   c) providing measured RF components as input variables to be operated on by performing said multivariate statistical analysis;
   d) performing said multivariate statistical analysis by use of a processor while said reactor is performing said plasma etch process to obtain a probability value which corresponds to said performance of said plasma etch process, wherein if said probability value is at a predesignated mean value, it corresponds to a desired performance of said plasma etch process, but a variance from said mean value corresponds to a variation from said desired performance of said plasma etch process, said multivariate statistical analysis evaluating overall performance of said plasma etch process based on all of said components and not basing performance separately on each individual component;
   e) determining if said probability value resides within a predesignated acceptable range from said mean value for said plasma etch process, wherein said probability value beyond said acceptable variation range indicates an unacceptable operating condition for said plasma etch process;
   f) utilizing said probability value to monitor operation of said reactor while said plasma etch process is on-going in said reactor;
   g) performing steps b) through f) until said plasma etch process is completed or until said unacceptable operating condition is detected;
   h) correcting said unacceptable operating condition once detected by adjusting said RF components until said probability value is back within said acceptable variation range;
   wherein real time in-situ control of said plasma etch process is achieved by utilizing said multivariate statistical analysis.

6. The method of claim 5 wherein said multivariate statistical analysis is determined by utilizing Hotelling's $T^2$ distribution to calculate said probability value.

7. The method of claim 6 wherein said RF components are derived from filtering a RF signal used to generate plasma in said plasma reactor.

8. The method of claim 7 further including the step of storing values of said measured RF components in a memory prior to performing said multivariate statistical analysis.

9. The method of claim 8 wherein said RF components are comprised of fundamental RF voltage and current, harmonic values of RF voltage and current, and a phase difference between said fundamental voltage and current.

10. The method of claim 9 wherein said plasma etch process is terminated in step h) when said unacceptable operating condition is noted in step g).

* * * * *

UNITED STATES PATENT AND TRADEMARK OFFICE
CERTIFICATE OF CORRECTION

PATENT NO. : 5,479,340
DATED : December 26, 1995
INVENTOR(S) : Edward P. Fox and Chandru Kuppuswamy It is certified that error appears in the above-indentified patent and that said Letters Patent is hereby corrected as shown below: On the title page;

Inventors, "Chandru Kappuswamy" should be --Chandra Kuppuswamy--.

Column 5, lines 15-17, "$T^2 = (Input_{[i]} - Mean_{[i]}) * (VAR/COVAR)^{-1} * (Input_{[i]} - Mean_{[i]})$" should be --$T^2 = (Input_{[i]} - Mean_{[i]} * (VAR/COVAR)^{-1} * (Input_{[i]} - Mean_{[i]})$--.

Column 5, lines 33-35, "$[VARIANCES\ and\ COVARIANCES]^{-1} = [\sigma^2\ AND\ \sigma\text{-}1]^{-1}$" should be --$[VARIANCES\ and\ COVARIANCES]^{-1} = [\sigma^2\ AND\ \sigma\text{-}1]^{-1}$--.

Columns 7 and 8, Table 1, line 24, " step 1 in T 2" should be --step 1 in T^2--.

Columns 7 and 8, Table 1, line 33, "T 2" should be --T^2--.

Columns 7 and 8, Table 1, line 36, "T 2" should be --T^2--.

Signed and Sealed this

Twenty-ninth Day of July, 1997

*Attest:*

BRUCE LEHMAN

*Attesting Officer*  *Commissioner of Patents and Trademarks*